(12) United States Patent
Wang

(10) Patent No.: US 6,352,629 B1
(45) Date of Patent: Mar. 5, 2002

(54) COAXIAL ELECTROMAGNET IN A MAGNETRON SPUTTERING REACTOR

(75) Inventor: Wei Wang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/612,861

(22) Filed: Jul. 10, 2000

(51) Int. Cl.[7] .............................................. C23C 14/34
(52) U.S. Cl. ................................. 204/298.2; 204/298.16
(58) Field of Search ...................... 204/192.12, 298.08, 204/298.16, 298.17, 298.18, 298.19, 298.2

(56) References Cited

U.S. PATENT DOCUMENTS

| | | | |
|---|---|---|---|
| 4,006,073 A | | 2/1977 | Welch .......................... 204/298 |
| 4,853,102 A | * | 8/1989 | Tateishi et al. ......... 204/298.16 |
| 4,880,515 A | * | 11/1989 | Yoshikawa et al. .... 204/192.12 |
| 5,069,770 A | | 12/1991 | Glocker ................. 204/192.12 |
| 5,085,755 A | | 2/1992 | Setoyama et al. ..... 204/298.16 |
| 5,455,197 A | * | 10/1995 | Ghanbari et al. ......... 204/298.2 |
| 5,556,519 A | * | 9/1996 | Teer ....................... 204/192.12 |
| 5,744,011 A | | 4/1998 | Okubo et al. .......... 204/192.12 |
| 5,795,451 A | * | 8/1998 | Tan et al. ................ 204/298.2 |
| 5,851,365 A | * | 12/1998 | Scobey ................. 204/192.12 |
| 5,897,752 A | * | 4/1999 | Hong et al. ............ 204/192.12 |
| 6,179,973 B1 | | 1/2001 | Lai et al. ................ 204/192.12 |

FOREIGN PATENT DOCUMENTS

| | | | |
|---|---|---|---|
| EP | 0 691 419 A1 | 1/1996 | ........... C23C/14/35 |
| JP | 54-37076 | * 3/1979 | ............ 204/298.19 |
| JP | 57-207173 | * 12/1982 | ............ 204/298.19 |

OTHER PUBLICATIONS

Anders, "Approaches to rid cathodic arc plasma of macro–and nanoparticles: a review," *Surface and Coatings Technology*, vols. 120–121, 1999, pp. 319–330.

\* cited by examiner

*Primary Examiner*—Rodney G. McDonald
(74) *Attorney, Agent, or Firm*—Charles S. Guenzer

(57) ABSTRACT

A magnetron sputter reactor capable of ionizing 15% or more of the metal atoms sputtered from the target. A small magnetron having closed bands of opposed magnetic polarity is rotated about the center of the target, and a large amount of power is applied to the target. Thereby the effective power density determined by the magnetron area is increased. A DC coil is wrapped around the space between the target and the substrate being sputter coated to generate an axial magnetic field to guide the metal ions towards the substrate. The pedestal electrode supporting the substrate may be negatively biased to accelerate the metal ions to deep within high aspect-ratio holes.

7 Claims, 1 Drawing Sheet

COAXIAL ELECTROMAGNET IN A MAGNETRON SPUTTERING REACTOR

FIELD OF THE INVENTION

The invention relates generally to plasma sputtering. In particular, the invention relates to auxiliary sources of magnetic field in magnetron sputtering.

BACKGROUND ART

Magnetron sputtering is a principal method of depositing metal onto a semiconductor integrated circuit during its fabrication in order to form electrically connections and other structures in the integrated circuit. A target is composed of the metal to be deposited, and ions in a plasma are attracted to the target at sufficient energy that target atoms are dislodged from the target, that is, sputtered. The sputtered atoms travel generally ballistically toward the wafer being sputter coated, and the metal atoms are deposited on the wafer in metallic form. Alternatively, the metal atoms react with another gas in the plasma, for example, nitrogen, to reactively deposit a metal compound on the wafer. Reactive sputtering is often used to form thin barrier and nucleation layers of titanium nitride or tantalum nitride on the sides of narrow holes.

DC magnetron sputtering is the most usually practiced commercial form of sputtering. The metallic target is biased to a negative DC bias in the range of about −400 to −600VDC to attract positive ions of the argon working gas toward the target to sputter the metal atoms. Usually, the sides of the sputter reactor are covered with a shield to protect the chamber walls from sputter deposition. The shield is usually electrically grounded and thus provides an anode in opposition to the target cathode to capacitively couple the DC target power into the chamber and its plasma.

A magnetron having at least a pair of opposed magnetic poles is disposed in back of the target to generate a magnetic field close to and parallel to the front face of the target. The magnetic field traps electrons, and, for charge neutrality in the plasma, additional argon ions are attracted into the region adjacent to the magnetron to form there a high-density plasma. Thereby, the sputtering rate is increased.

However, conventional sputtering presents challenges in the formation of advanced integrated circuits. As mentioned above, sputtering is fundamentally a ballistic process having an approximate isotropic sputtering pattern that is well suited for coating planar surfaces but ill suited for depositing metal into the narrow features characteristic of advanced integrated circuits. For example, advanced integrated circuits include many inter-level vias having aspect ratios of 5:1 and higher, which need to be coated and filled with metal. However, techniques have been developed for drawing the sputtered atoms deep within the narrow, deep holes to coat the bottom and sides and then to fill the hole with metal without bridging the hole and thereby forming an included void.

A general technique for sputtering into deep holes is to cause the sputtered atoms to be ionized and to additionally negatively bias the wafer to cause the positively charged sputtered metal atoms to accelerate toward the wafer. Thereby, the sputtering pattern becomes anisotropic and directed toward the bottom of the holes. A negative self-bias naturally develops on an electrically floating pedestal. However, for more control, a voltage may be impressed on the pedestal. Typically, an RF power supply is coupled to a pedestal electrode through a coupling capacitor, and a negative DC self-bias voltage develops on the pedestal adjacent to the plasma.

At least two techniques are available which increase the plasma density in the sputtering chamber and thereby increase the fraction of ionized sputtered atoms.

One method, called ionized metal plating (IMP), uses an RF inductive coil wrapped around the processing space between the target and the wafer to couple RF energy in the megahertz frequency range into the processing space. The coil generates an axial RF magnetic field in the plasma which in turn generates a circumferential electric field at the edges of the plasma, thereby coupling energy into the plasma in a region remote from the wafer and increasing its density and thereby increasing the metal ionization rate. IMP sputtering is typically performed at a relatively high argon pressure of 50 to 100 milliTorr.

IMP is very effective at deep hole filing. Its ionization fraction can be well above 50%. However, IM Pequipment is relatively expensive. Even more importantly,IMP tends to be a hot energetic, high pressure process in which a large number of argon ions are also accelerated toward the wafer. Film quality resulting from IMP is not optimal for all applications.

A recently developed technology of self-ionized plasma (SIP) sputtering allows plasma sputtering reactors to be only slightly modified but to nonetheless achieve efficient filling of metals into high aspect-ratio holes in a low-pressure, low-temperature process. This technology has been described by Fu et al. in U.S. patent application Ser. No. 09/546,798, filed Apr. 11, 2000, and by Chiang et al. in U.S. patent application Ser. No. 09/414,614, filed Oct. 8, 1999, both incorporated herein by reference in their entireties.

The SIP sputter reactor described in the above cited patents is modified from a conventional magnetron sputter reactor configured for single-wafer processing. SIP sputtering uses a variety of modifications to a fairly conventional capacitively coupled magnetron sputter reactor to generate a high-density plasma adjacent to the target and to extend the plasma and guide the metal ions toward the wafer. Relatively high amounts of DC power arc applied to the target, for example, 20 to 40 kW for a chamber designed for 200 mm wafers. Furthermore, the magnetron has a relatively small area so that the target power is concentrated in the smaller area of the magnetron, thus increasing the power density supplied to the HDP region adjacent the magnetron. The small-area magnetron is disposed to a side of a center of the target and is rotated about the center to provide more uniform sputtering and deposition.

In one type of SIP sputtering, the magnetron has unbalanced poles, usually a strong outer pole of one magnetic polarity surrounding a weaker inner pole. The magnetic field lines emanating from the stronger pole may be decomposed into not only a conventional horizontal magnetic field adjacent the target face but also a vertical magnetic field extending toward the wafer. The vertical field lines extend the plasma closer toward the wafer and also guide the metal ions toward the wafer. Furthermore, the vertical magnetic lines close to the chamber walls act to block the diffusion of electrons from the plasma to the grounded shields. The reduced electron loss is particularly effective at increasing the plasma density and extending the plasma across the processing space.

Gopalraja et al. disclose another type of SIP sputtering, called SIP$^+$ sputtering, in U.S. patent application Ser. No. 09/518,180, filed Mar. 2, 2000, also incorporated herein by reference in its entirety. SIP$^+$ sputtering relies upon a target having a shape with an annular vault facing the wafer. Magnets of opposed polarities disposed behind the facing sidewalls of the vault produce a high-density plasma in the vault. The magnets usually have a small circumferential extent along the vault sidewalls and are rotated about the target center to provide uniform sputtering. Although some of the designs use asymmetrically sized magnets, the magnetic field is mostly confined to the volume of the vault.

SIP sputtering may be accomplished without the use of RF inductive coils. The small HDP region is sufficient to ionize a substantial fraction of metal ions, estimated to be between 10 and 25%, which is sufficient to reach into deep holes. Particularly at the high ionization fraction, the ionized sputtered metal atoms are attracted back to the targets and sputter yet further metal atoms. As a result, the argon working pressure may be reduced without the plasma collapsing. Therefore, argon heating of the wafer is less of a problem, and there is reduced likelihood of the metal ions colliding with argon atoms, which would both reduce the ion density and randomize the metal ion sputtering pattern.

However, SIP sputtering could still be improved. The ionization fraction is only moderately high. The remaining 75 to 90% of the sputtered metal atoms are neutral and not subject to acceleration toward the biased wafer. This generally isotropic neutral flux does not easily enter high-aspect ratio holes. Furthermore, the neutral flux produces a non-uniform thickness between the center and the edge of wafer since the center is subjected to deposition from a larger area of the target than does the edge when accounting for the wider neutral flux pattern.

One method of decreasing the neutral flux relative to the ionized flux is to increase the throw of the sputter reactor, that is, the spacing between the target and pedestal. For a 200 mm wafer, a conventional throw may be 190 mm while a long throw may be 290 mm. Long throw may be defined as a throw that is greater than 125% of the wafer diameter. In long throw, the more isotropic neutral flux preferentially deposits on the shields while the anisotropic ionized flux is not substantially reduced. That is, the neutrals are filtered out.

However, long-throw sputtering has drawbacks when combined with SIP sputtering relying upon an unbalanced magnetron to project the magnetic field toward the wafer. The vertical magnetic component is relatively weak and rapidly attenuates away from the target since it necessarily returns to the magnetron. It is estimated that for a typical unbalanced magnetron producing a 1 kilogauss horizontal magnetic field at the target produces only a 10 gauss vertical magnetic field 100 mm from the target, and it rapidly decreases yet further away. Therefore, an unbalanced magnetron in a long-throw sputter reactor does not provide the magnetic plasma support and magnetic guidance close to the wafer that is needed to obtain the beneficial results of SIP sputtering.

Another problem arises in SIP sputtering using a strongly unbalanced magnetron because the vertical components of the magnetic field close to the wafer are invariably non-uniform as they are being attracted back toward the magnetron. Such non-uniformity in the magnetic field is bound to degrade the uniformity of sputtering across the wafer.

Also, in SIP+ sputtering with the vaulted target, there is relatively little magnetic field extending out of the vault to support the plasma and guide the metal ions toward the wafer.

Accordingly, it is desired to provide a better alternative for magnetic confinement and guidance of ionized sputtered atoms.

SUMMARY OF THE INVENTION

In a magnetron sputter reactor, a coil is wrapped around the processing space between the target and pedestal supporting the substrate being sputter coated. The coil is powered, preferably by a DC power supply, to generate an axial field in the sputter reactor. The axial magnetic field is preferably in the range of 15 to 100 gauss.

The magnetron preferably is unbalanced with a stronger pole surrounding a weaker inner pole of the opposed magnetic polarity. The stronger pole preferably generates a magnetic flux parallel to the magnetic flux generated by the coaxial DC coil.

DETAILED DESCRIPTION OF THE PREFERRED EMBODIMENTS

Figure 1:
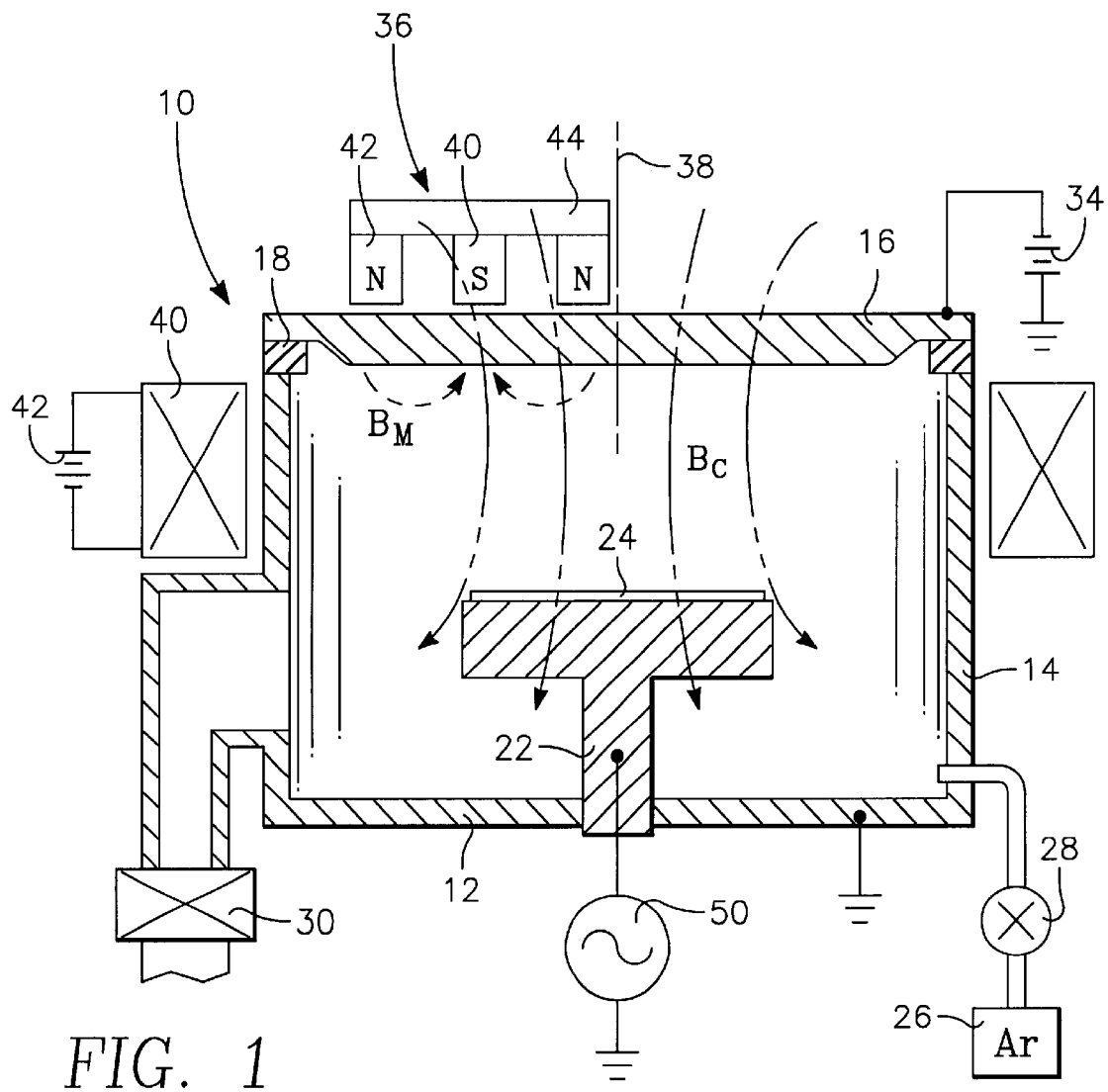
FIG. 1 is a schematic cross-sectional view of a sputter reactor including a magnetic coil of the invention.

A first embodiment of a plasma sputtering reactor 10 of the invention is illustrated in the schematic cross-section view of FIG. 1. A vacuum chamber 12 includes generally cylindrical sidewalls 14, which are electrically grounded. Typically, unillustrated grounded replaceable shields are located inside the sidewalls 14 to protect them from being sputter coated, but they act as chamber sidewalls except for holding a vacuum. A sputtering target 16 composed of the metal to be sputtered is sealed to the chamber 12 through an insulator 18. A pedestal electrode 22 supports a wafer 24 to be sputter coated in parallel opposition to the target 16.

A sputtering working gas, preferably argon, is metered into the chamber from a gas supply 26 through a mass flow controller 28. A vacuum pumping system 30 maintains the interior of the chamber 12 at a very low base pressure of typically $10^{-8}$ Torr or less. During plasma ignition, the argon pressure is supplied in an amount producing a chamber pressure of approximately 5 milliTorr, but as will be explained later the pressure is thereafter decreased. A DC power supply 34 negatively biases the target 16 to approximately −60 VDC causing the argon working gas to be excited into a plasma containing electrons and positive argon ions. The positive argon ions are attracted to the negatively biased target 16 and sputter metal atoms from the target.

The invention is particularly useful with SIP sputtering in which a small magnetron is supported on an unillustrated back plate behind the target 36. An unillustrated motor and drive shaft aligned to a central axis 38 rotates the back plate and the target about the central axis 38. The chamber 12 and target 16 are generally circularly symmetric about the central axis 38. The SIP magnetron 36 includes an inner magnet pole 40 of one magnetic polarity and a surrounding outer magnet pole 42 of the other magnetic polarity, both supported by and magnetically coupled through a magnetic yoke 44. In an unbalanced magnetron, the outer pole 42 has a total magnetic flux integrated over its area that is larger than that produced by the inner pole 40. The opposed magnetic poles create a magnetic filed $B_M$ inside the chamber 12 with strong components parallel and close to the face of the target 16 to create a high-density plasma there to thereby increase the sputtering rate and increase the ionization fraction of the sputtered metal atoms. An RF power supply 50, for example, having a frequency of 13.56 MHz is connected to the pedestal electrode 22 to create a negative self-bias on the wafer 24. The bias attracts the positively charged metal atoms across the sheath of the adjacent plasma, thereby coating the sides and bottoms of high aspect-ratio holes.

In SIP sputtering, the magnetron is small and has a high magnetic strength and a high amount of DC power is applied to the target so that the plasma density rises to above $10^{10}$ cm$^{-3}$ near the target 16. In the presence of this plasma density, a large number of sputtered atoms are ionized into positively charged metal ions. The metal ion density is high enough that a large number of them are attracted back to the target to sputter yet further metal ions. As a result, the metal ions can at least partially replace the argon ions as the effective working species in the sputtering process. That is, the argon pressure can be reduced. The reduced pressure has the advantage of reducing scattering and deionization of the metal ions. For copper sputtering, under some conditions it is possible in a process called sustained self-sputtering (SSS) to completely eliminate the argon working gas once the plasma has been ignited. For aluminum or tungsten sputtering, SSS is not possible, but the argon pressure can be substantially reduced from the pressures used in conventional sputtering, for example, to less than 1 milliTorr.

According to the invention, an electromagnet 40 is positioned around the chamber sidewalls 14 to produce a magnetic field $B_C$ extending generally parallel to the chamber axis 38 between the target 16 and the wafer 24. The electromagnet 40 is most typically a coil wrapped around the sidewalls 14 and supplied with DC power from a power source 42. The coil is generally centered about the central axis 38 and thus coaxial with the chamber 12 and the target 16.

Since the magnetic field of the unbalanced magnetron 36 is still helpful for confining electrons near the top portion of the chamber sidewall, it is preferable that the direction of the coil field $B_C$ be generally parallel with the magnetic field produced by the outer magnetron pole 42.

The coil magnetic field $B_C$ is strong enough to trap plasma electrons to produce two beneficial effects. Electron loss to the unillustrated grounded shield (or equivalently to the grounded chamber sidewall 14) is reduced, thus increasing the plasma density. Furthermore, the magnetic field lines extend toward the wafer 24, and plasma electrons gyrate around them in a spiral pattern and travel toward the wafer 24. The metal ions, even if not trapped by the magnetic field lines, follow the plasma electrons toward the wafer 24. The effect is to increases the sputtered metal ion flux incident on the wafer. The ionized flux is effective at filling deep, narrow holes or coating their sides.

The previously described SIP sputtering relies upon a strongly unbalanced magnetron, that is, one having magnetic poles of significantly different total strengths, to project the magnetic field toward the wafer. The unbalanced approach has the disadvantage that the projected magnetic field is distinctly non-uniform in the vicinity of the wafer. In contrast, the sputter reactor of FIG. 1 does not require a strongly unbalanced magnetron to project the magnetic field. Instead, the electromagnet 40 projects a substantially uniform, axial magnetic field $B_C$ from the target to the wafer 24.

Another difficulty with the use of an unbalanced magnetron for projecting the magnetic field is that only the unbalanced portion is projected, and this portion must return to the back of the magnetron. Such a field rapidly attenuates with distance, typically with a dependence of the fourth power of distance. Exemplary attenuation is that a 1000 gauss field is reduced to 10 gauss over 100 mm. Furthermore, SIP ionization rates are limited to about 25%. The remaining 75% of sputtered metal atoms are neutral, and the wafer biasing is ineffective at directing the neutral component to deep within high-aspect ratio holes. It is desirable to filter out the neutral component by extending the throw of the sputter reactor, for example, to 290 mm for a 200 mm wafer. The long throw has the further advantage of increasing the center-to-edge uniformity. However, unbalanced magnetrons cannot easily project the magnetic field over these increased distances.

The invention thus reduces the need for an unbalanced magnetron. In particular, many of the advantages of SIP sputtering using the magnetic coil of the invention can be achieved with a small rotatable magnetron having inner and outer closed magnetic bands of the same or substantially the same magnetic strengths of opposed magnetic polarities. Closed magnetrons with a parallel band structure are well known and are easily achieved with horseshoe magnets arranged in a close shape and providing a strong magnetic field between the poles of the horseshoe magnets, as has been disclosed by Parker in U.S. Pat. No. 5,242,566 and by Tepman in U.S. Pat. No. 5,320,728. However, these magnetrons are large magnetrons, not conforming to the requirement that a SIP magnetron have an encompassing area smaller than a circle extending from the target center to the periphery of its usable area or, alternatively, that the target be divided into two half-spaces separated by a plane passing through the central axis and that the magnetron be principally disposed in one half-space and not extend into the other half-space by more than 15% of the target radius.

In contrast, the magnetic coil of the invention produces a magnetic field that is substantially axially uniform over the length of the coil, and even outside the coil the magnetic field strength does not diminish precipitously. Accordingly, the throw of the sputter reactor can be increased without unnecessarily reducing the metal ion flux.

Okubo et al. in U.S. Pat. No. 5,744,011 have disclosed a DC coil wrapped around a large magnetron. However, their configuration is predicated on a large stationary magnetron so that the combination of magnetron and coil field produces a horizontal magnetic field near the substrate being coated. In contrast, the coil of the invention produces a vertical magnetic field at the wafer, and the field of the magnetron is substantially limited to near the target. In quantifiable terms, the combined magnetron and coil magnetic field is incident at all parts of the wafer at no more than 20° from the normal, preferably no more than 10°. Another distinguishing factor associated with the normal incident magnetic is that the coil of the present invention extends towards the wafer in an area at least as close to the pedestal as to the target and preferably past the 75% distance of the path from the target to the pedestal. Thereby, the coil magnetic field has less opportunity to deflect as it returns to the outside of the coil. In contrast, Okubo et al. place their coil close to the target so that the coil field is largely horizontal near the wafer.

The invention has been tested by wrapping 300 to 400 turns of electrical wire around the chamber sidewall 14. A coil current of 2 A produces an axial magnetic field $B_C$ of about 100 gauss.

Figure 2:
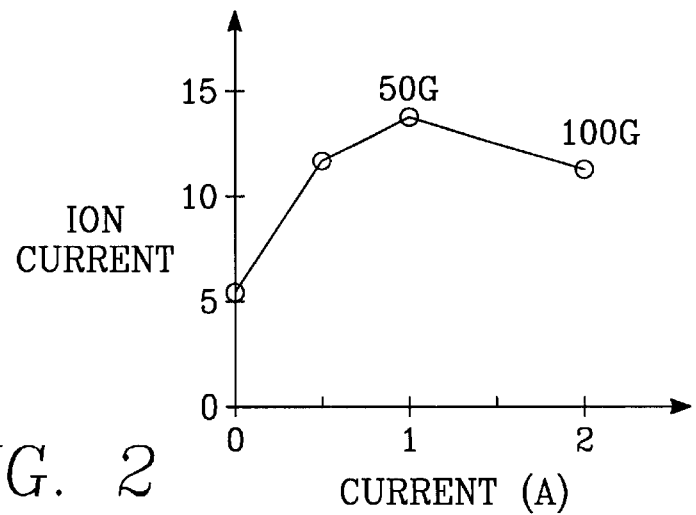
FIG. 2 is a graph illustrating the dependence of ion flux upon applied magnetic field.

A sputter reactor having a copper target and a racetrack magnetron of the sort described by Fu et al. was tested with such an electromagnet. The target was powered with 35 kW of DC power, and the pedestal was biased with 300 W of 13.56 MHz power with a flow of 5 sccm of argon into the chamber. The ion current to the pedestal electrode was measured as a function of coil current. The results are shown in the graph of FIG. 2. A coil current of 1 A producing a coil field of 50 gauss increases the ion current to the pedestal by more than a factor of two. The quoted magnetic fields are measured in the bore of the coil near its center. The central axial field may be approximated for a very thin coil as $$B_C = NI \frac{a^2}{2(a^2 + z^2)^{3/2}},$$

where I is the coil current, N is the number of turns, a is the radius of the coil, and z is the axial distance from the coil.

In the context of sputtering into deep holes, a high ion current is preferred. However, a further increase to 2 A and 100 gauss causes the observed ion current to decrease. It is believed the decrease is caused by the axial coil field interfering with the electron trapping of the horizontal magnetron field. From these results, it becomes apparent that for typical SIP magnetrons, the coil field should be greater than 15 gauss and less than 100 gauss.

The DC magnetic coil of the invention advantageously differs from the RF coil of an IMP reactor in that it may be placed outside of the chamber as long as the chamber and shields are composed of non-magnetic materials. In contrast, an RF coil such as that used in an inductively coupled IMP reactor needs to be placed inside of the chamber and even inside of the shield (unless the shield is turned into a Faraday shield). Otherwise, the conductive chamber and shield will short the RF fields.

Some of the advantages of the invention can be employed by replacing the coil with an annular magnet magnetized along its axis or equivalent by a series of axially polarized magnets arranged circumferentially about the chamber sidewalls. However, the coil is more effective at producing a uniform magnetic field and can be controlled for different values of magnet field.

It is possible to enjoy many of the advantages of the invention with a sub-kilohertz AC powering of the coil, specifically a frequency of less than 1 kHz. However, DC coil power is best because it is always producing its maximum effect with no nulls.

The magnetic coil of the invention may also be advantageously applied to a sputter reactor with a vaulted target such as that described by Gopalraja et al. for SIP+ sputtering. The coil is particularly advantageous for vaulted targets since the restrained geometry involved in placing magnets on opposed lateral sides of the vault makes strongly unbalanced magnetrons difficult to achieve.

Although the invention has been described as a substitute for an inductively coupled IMP sputter reactor, a coaxial magnetic coil of the invention may be combined with such an IMP sputter reactor. Unlike the RF magnetic field produced by an RF coil, a DC or low-AC magnetic field of the invention can deeply penetrate the high density plasma of the IMP sputter reactor.

The invention thus provides additional controls for magnetron sputtering with the addition of a standard and economical coil. The invention has been shown to be effective at generating a high ionization fraction of sputtered metal atoms useful for deep hole filling.

What is claimed is:

1. A sputter reactor, comprising:

a vacuum chamber having sidewalls;

a sputtering target sealed to but electrically isolated from said sidewalls of said vacuum chamber and configured to be electrically biased;

a magnetron principally disposed on one side of a central axis of said chamber at a backside of said target, rotatable about said axis, and comprising an inner pole of a first magnetic polarity and having a first total magnetic flux and an outer pole of a second magnetic polarity opposite said first magnetic polarity and having a second total magnetic flux larger than said first total magnetic flux, said magnetron having an area smaller than that of said target and being rotatable about a central axis thereof;

a pedestal for supporting a substrate to be sputter coated with material of said target while disposed in opposition to said target along said sidewalls; and magnetic field means including a coil wrapped around said sidewalls and configured to be electrically powered to produce a magnetic field extending along said central axis in a region between said target and said pedestal, having said second magnetic polarity in said region, and being incident upon said substrate supported by said pedestal at an angle deviating by no more than 20° from said central axis.

2. The sputter reactor of claim 1, further comprising a DC power supply connectable to said coil.

3. The sputter reactor of claim 1, further comprising an AC power supply having a frequency of less than 1 kHz connectable to said coil.

4. The sputter reactor of claim 1, wherein said angle is no more than 10°.

5. The sputter reactor of claim 1, wherein said substrate is substantially circular and a spacing between said target and said pedestal is larger than 125% of a diameter of said substrate.

6. The sputter reactor of claim 1, wherein said inner pole is disposed away from said central axis.

7. A sputter reactor, comprising:

a vacuum chamber having sidewalls;

a sputtering target sealed to said sidewalls;

a magnetron disposed at a back of said target and rotatable about a central axis and comprising an inner pole producing a magnetic field of a first polarity adjacent to a face of said target and an outer pole surrounding said inner pole and producing a magnetic field of a second polarity adjacent to a face of said target, wherein said inner pole is disposed away from said central axis, wherein said inner pole produces a first total magnetic flux and said outer pole produces a second total magnetic flux larger than said first total magnetic flux;

a pedestal for supporting a substrate to be sputter coated with material of said target while in opposition to said target along said sidewalls;

a coil wrapped about said central axis and extending from said target to a distance of at least 75% along a path from said target to said pedestal; and a DC power supply connectable to said coil;

wherein said coil and DC power supply create a magnetic field of said first polarity in an interior of said coil.

* * * * *